(12) United States Patent
Weisgerber et al.

(10) Patent No.: US 7,301,304 B2
(45) Date of Patent: Nov. 27, 2007

(54) ENERGY STORAGE SYSTEM STATE OF CHARGE DIAGNOSTIC

(75) Inventors: Scott T. Weisgerber, Fishers, IN (US); William R. Cawthorne, Milford, MI (US)

(73) Assignee: General Motors Corporation, Detroit, MI (US)

( * ) Notice: Subject to any disclaimer, the term of this patent is extended or adjusted under 35 U.S.C. 154(b) by 286 days.

(21) Appl. No.: 10/779,481

(22) Filed: Feb. 14, 2004

(65) Prior Publication Data
US 2005/0189918 A1    Sep. 1, 2005

(51) Int. Cl.
*H02J 7/00*    (2006.01)

(52) U.S. Cl. .................................. 320/132; 320/136
(58) Field of Classification Search ................ 320/132, 320/134, 136, 104; 324/427
See application file for complete search history.

(56) References Cited

U.S. PATENT DOCUMENTS

| | | | | |
|---|---|---|---|---|
| 5,786,640 | A * | 7/1998 | Sakai et al. | 290/17 |
| 6,166,517 | A * | 12/2000 | Wakashiro et al. | 320/104 |
| 6,388,421 | B2 * | 5/2002 | Abe | 320/104 |
| 6,841,972 | B2 * | 1/2005 | Koo | 320/132 |
| 6,868,318 | B1 * | 3/2005 | Cawthorne et al. | 320/134 |

* cited by examiner

*Primary Examiner*—Bao Q. Vu
*Assistant Examiner*—Aaron Piggush

(57) ABSTRACT

An energy storage system determined to be at an operating point indicative of incipient threat to its condition is permitted to continue power flow for a duration that is a function of the state of charge before a diagnosis of a critical state of charge condition is rendered. If the state of charge returns to an acceptable region before the duration expires, no diagnosis of a critical state of charge condition is rendered. Generally, the duration increases as the state of charge trends toward the region of acceptable state of charge and decreases as the state of charge trends away from the region of acceptable state of charge.

10 Claims, 7 Drawing Sheets

ENERGY STORAGE SYSTEM STATE OF CHARGE DIAGNOSTIC

TECHNICAL FIELD

This invention is related to monitoring and control of energy storage systems in hybrid electric vehicles (HEV). More particularly, this invention is concerned with precision diagnosis of energy storage system state of charge.

BACKGROUND OF THE INVENTION

A HEV is a vehicle having a propulsion system that consists of at least one electric motor or electric machine in combination with at least one other power source. Typically, the other power source is a gasoline or diesel engine. There are various types of HEVs depending on how the electric motor(s) and other power source(s) are combined with one another in order to provide propulsion for the vehicle, including series, parallel and compound HEVs.

Various hybrid powertrain architectures are known for managing the input and output torques of various prime-movers in hybrid vehicles, most commonly internal combustion engines and electric machines. Series HEV architectures are generally characterized by an internal combustion engine driving an electric generator which in turn provides electrical power to an electric drivetrain and to an energy storage system, comprising a battery pack. The internal combustion engine in a series HEV is not directly mechanically coupled to the drivetrain. The electric generator may also operate in a motoring mode to provide a starting function to the internal combustion engine, and the electric drivetrain may recapture vehicle braking energy by also operating in a generator mode to recharge the battery pack.

Parallel HEV architectures are generally characterized by an internal combustion engine and an electric motor which both have a direct mechanical coupling to the drivetrain. The drivetrain conventionally includes a shifting transmission to provide the necessary gear ratios for wide range operation.

Electrically variable transmissions (EVT) are known which provide for continuously variable speed ratios by combining features from both series and parallel HEV powertrain architectures. EVTs are operable with a direct mechanical path between an internal combustion engine and a final drive unit thus enabling high transmission efficiency and application of lower cost and less massive motor hardware. EVTs are also operable with engine operation mechanically independent from the final drive or in various mechanical/electrical split contributions (i.e. input split, output split and compound split configurations) thereby enabling high-torque continuously variable speed ratios, electrically dominated launches, regenerative braking, engine off idling, and two-mode operation.

Such complex EVT HEVs utilize one or more electric machines and require advanced energy storage systems (ESS) to supply electrical energy to and receive and store electrical energy from these machines. The ESS typically incorporates a battery pack and associated monitoring and control electronics and algorithms. Given the dynamics associated with operation of an HEV, particularly the constant flow of power into and out of the ESS, the ESS plays a critical role in the operation of these vehicles. The critical role of the ESS in these vehicles imposes a number of requirements on ESS performance, including both operational and service life requirements.

State of charge (SOC) is defined generally as the ratio of the residual charge in a battery or battery pack relative to full charge capacity. Significant attention has been given to maintaining the operational performance of batteries used as the ESS in HEV applications. Particular attention has been given to various aspects of not only maintaining the battery pack state of charge but also preventing battery pack overcharge and depletion which can lead to battery pack damage. Various hardware and software control strategies have been suggested for determining and maintaining the SOC of battery packs and preventing potentially damaging operation at extreme low and high SOC conditions. Unfortunately, however, known systems effective to prevent damage to battery packs do so by shutting down further energy transfers into and out of the battery pack, thereby undesirably disabling vehicle operation or severely limiting vehicle performance until service can be sought.

SUMMARY OF THE INVENTION

While preventing damage to battery packs is critical to extending the service life thereof, disabling vehicle operation is a particularly undesirable solution to extremely high and low SOC conditions. It is therefore desireable to prevent damage to battery packs experiencing extreme SOC conditions while also avoiding vehicle disablement.

Therefore, the present invention provides for a robust energy system sytate of charge diagnostic effective to closely monitor present energy storage system state of charge in regions of extreme state of charge while providing an opportunity for the state of charge to recover to acceptable levels.

In accordance with the present invention, power flow and state of charge are obtained. From the combination thereof, a determination is made whether an incipient threat to battery condition exits. If such a condition is determined to exist, the state of charge is closely monitored and power flow is allowed to proceed as normal for a duration that is dependent upon the state of charge movement toward or away from a region of acceptable state of charge. Generally, movement toward the region of acceptable state of charge extends the duration of continued power flow since it is assumed the power flow is in a direction that is improving the state of charge whereas movement away from the region of acceptable state of charge contracts the duration of continued power flow since it is assumed the power flow is in a direction that is not improving the state of charge.

In accordance with a preferred implementation, a plurality of state of charge thresholds are provided at extreme regions of state of charge. Increment values are provided corresponding to these thresholds. The increment values are generally larger at more extreme states of charge. As long as the state of charge violates any of the thresholds, a counter increments in accordance with the increment corresponding to the violated threshold. A predetermined counter limit is provided which, if exceed, will result in an indication that a critical state of charge condition is present.

BRIEF DESCRIPTION OF THE DRAWINGS

The present invention will become more fully understood from the detailed description given here below, the appended claims, and the accompanying drawings in which:

DESCRIPTION OF THE PREFERRED EMBODIMENT

Figure 1:
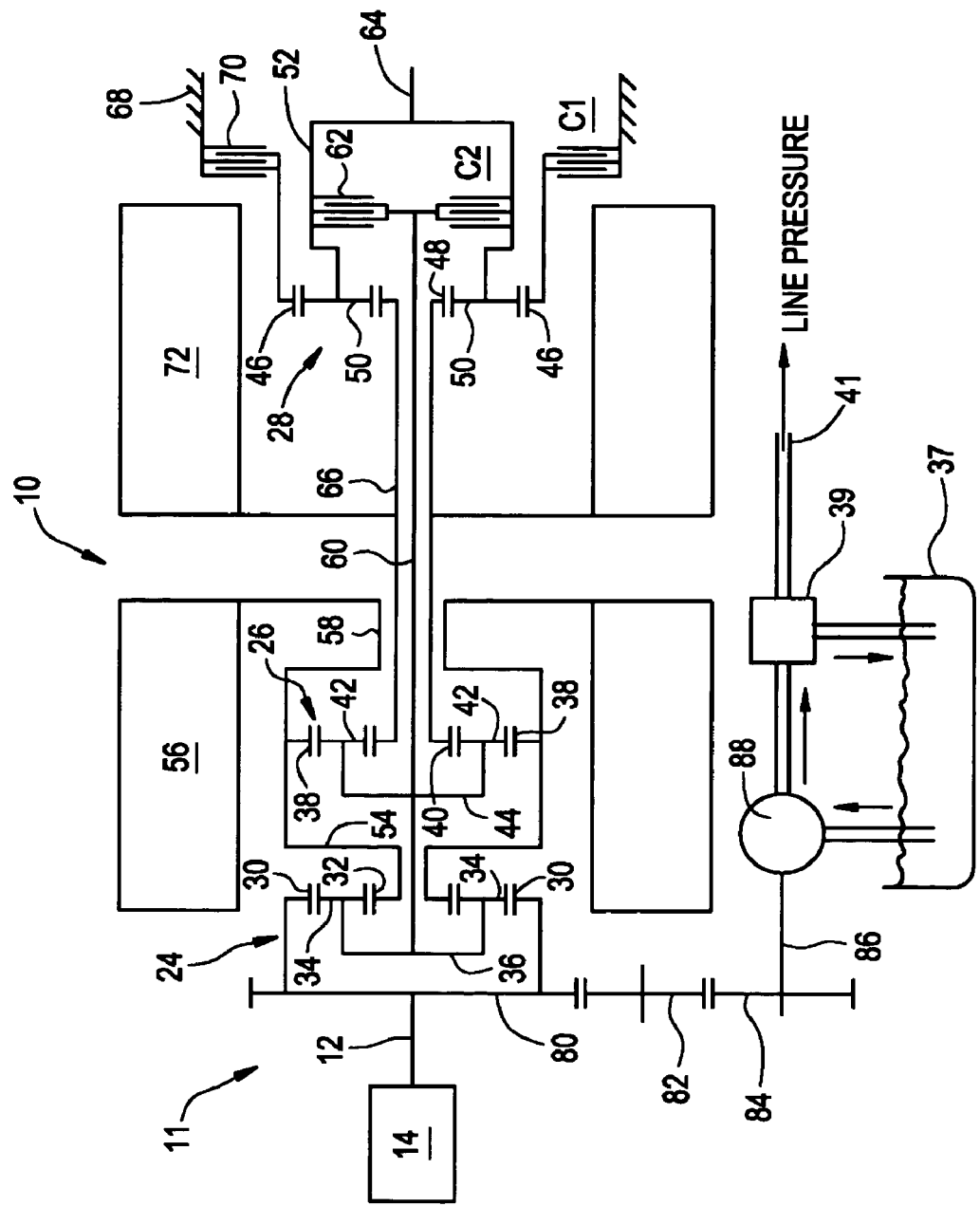
FIG. 1 is a mechanical hardware schematic representation of one preferred form of a two-mode, compound-split, electrically variable transmission particularly suited to the implementation of the present invention.
Figure 2:
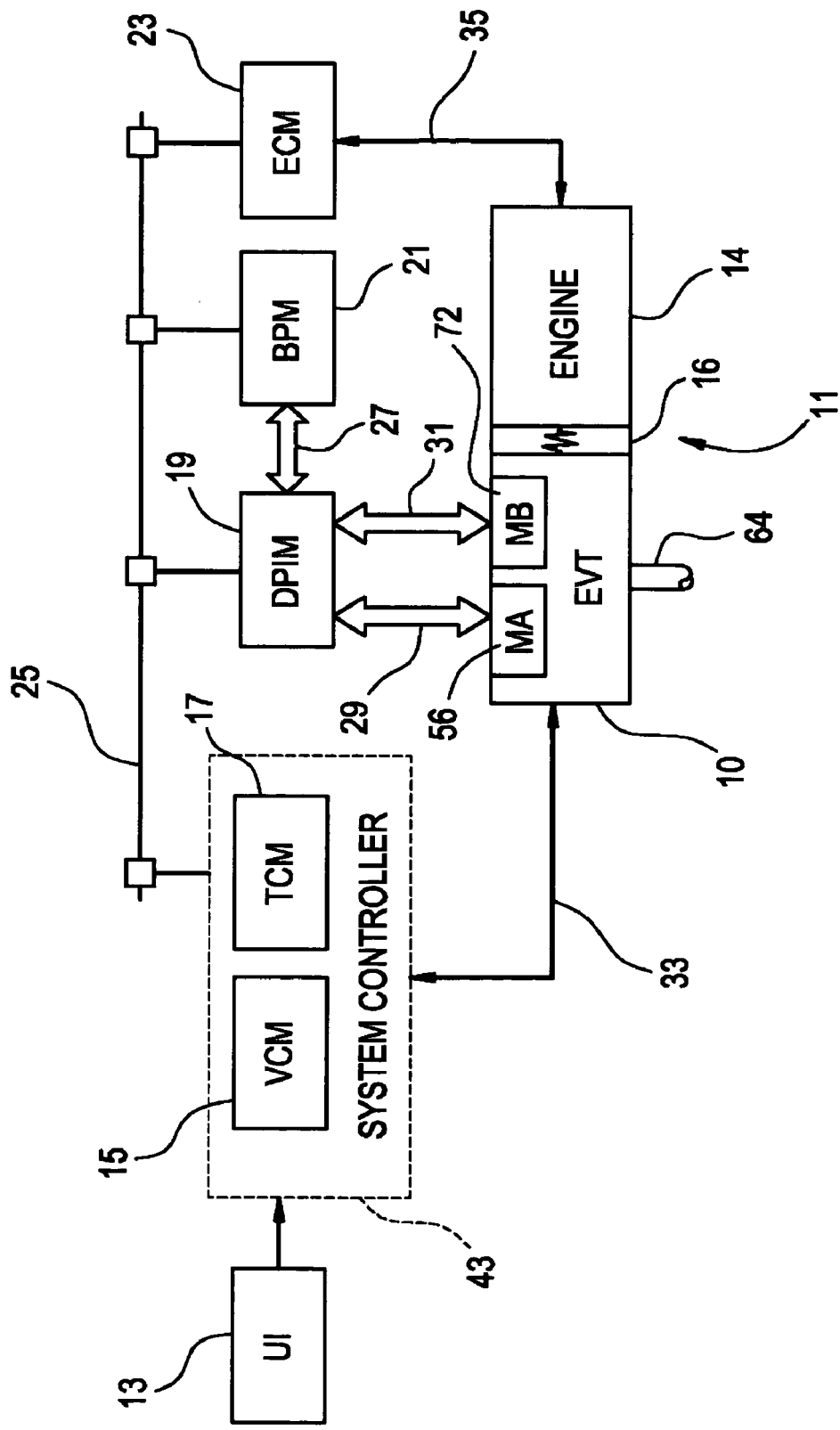
FIG. 2 is an electrical and mechanical schematic of a preferred system architecture for the hybrid powertrain disclosed herein.

With reference first to FIGS. 1 and 2, a vehicular powertrain is generally designated 11. Included in the powertrain 11 is one representative form of a multi-mode, compound-split, electrically variable transmission (EVT) particularly suited for implementing the controls of the present invention and designated generally by the numeral 10 in FIGS. 1 and 2. With particular reference, then, to those figures, the EVT 10 has an input member 12 that may be in the nature of a shaft which may be directly driven by an engine 14 or, as shown in FIG. 2, a transient torque damper 16 may be incorporated between the output member of the engine 14 and the input member of the EVT 10. The transient torque damper 16 may incorporate, or be employed in conjunction with, a torque transfer device (not shown) to permit selective engagement of the engine 14 with the EVT 10, but it must be understood that such a torque transfer device is not utilized to change, or control, the mode in which the EVT 10 operates.

In the embodiment depicted the engine 14 may be a fossil fuel engine, such as a diesel engine which is readily adapted to provide its available power output delivered at a constant number of revolutions per minute (RPM). In the exemplary embodiment to which FIGS. 1 and 2 are directed, the engine 14 can—after start-up, and during the majority of its input—operate at a constant speed or at a variety of constant speeds in accordance with a desired operating point as may be determined from operator inputs and driving conditions.

The EVT 10 utilizes three planetary gear subsets 24, 26 and 28. The first planetary gear subset 24 has an outer gear member 30, that may generally be designated as the ring gear, which circumscribes an inner gear member 32, generally designated as the sun gear. A plurality of planet gear members 34 are rotatably mounted on a carrier 36 such that each planet gear member 34 meshingly engages both the outer gear member 30 and the inner gear member 32.

The second planetary gear subset 26 also has an outer gear member 38, generally designated as the ring gear, which circumscribes an inner gear member 40, generally designated as the sun gear. A plurality of planet gear members 42 are rotatably mounted on a carrier 44 such that each planet gear 42 meshingly engages both the outer gear member 38 and the inner gear member 40.

The third planetary gear subset 28 also has an outer gear member 46, generally designated as the ring gear, which circumscribes an inner gear member 48, generally designated as the sun gear. A plurality of planet gear members 50 are rotatably mounted on a carrier 52 such that each planet gear 50 meshingly engages both the outer gear member 46 and the inner gear member 48.

While all three planetary gear subsets 24, 26 and 28 are "simple" planetary gear subsets in their own right, the first and second planetary gear subsets 24 and 26 are compounded in that the inner gear member 32 of the first planetary gear subset 24 is conjoined, as through a hub plate gear 54, to the outer gear member 38 of the second planetary gear subset 26. The conjoined inner gear member 32 of the first planetary gear subset 24 and the outer gear member 38 of the second planetary gear subset 26 are continuously connected to a first motor/generator 56, as by a sleeve shaft 58. First motor/generator 56 may also be referred to herein variously as motor A or $M_A$.

The planetary gear subsets 24 and 26 are further compounded in that the carrier 36 of the first planetary gear subset 24 is conjoined, as through a shaft 60, to the carrier 44 of the second planetary gear subset 26. As such, carriers 36 and 44 of the first and second planetary gear subsets 24 and 26, respectively, are conjoined. The shaft 60 is also selectively connected to the carrier 52 of the third planetary gear subset 28, as through a torque transfer device 62 which, as will be hereinafter more fully explained, is employed to assist in the selection of the operational modes of the EVT 10. Torque transfer device 62 may also be referred to herein variously as second clutch, clutch two or C2.

The carrier 32 of the third planetary gear subset 28 is connected directly to the transmission output member 64. When the EVT 10 is used in a land vehicle, the output member 64 may be connected to the vehicular axles (not shown) that may, in turn, terminate in the drive members (also not shown). The drive members may be either front or rear wheels of the vehicle on which they are employed, or they may be the drive gear of a track vehicle.

The inner gear member 40 of the second planetary gear subset 26 is connected to the inner gear member 48 of the third planetary gear subset 28, as through a sleeve shaft 66 that circumscribes shaft 60. The outer gear member 46 of the third planetary gear subset 28 is selectively connected to ground, represented by the transmission housing 68, through a torque transfer device 70. Torque transfer device 70, as is also hereinafter explained, is also employed to assist in the selection of the operational modes of the EVT 10. Torque transfer device 70 may also be referred to herein variously as first clutch, clutch one or C1.

The sleeve shaft 66 is also continuously connected to a second motor/generator 72. Second motor/generator 72 may also be referred to herein variously as motor B or $M_B$. All the planetary gear subsets 24, 26 and 28 as well as motor A and motor B (56, 72) are coaxially oriented, as about the axially disposed shaft 60. It should be noted that both motors A and B are of an annular configuration which permits them to circumscribe the three planetary gear subsets 24, 26 and 28 such that the planetary gear subsets 24, 26 and 28 are disposed radially inwardly of the motors A and B. This configuration assures that the overall envelope—i.e.: the circumferential dimension—of the EVT 10 is minimized.

A drive gear 80 may be presented from the input member 12. As depicted, the drive gear 80 fixedly connects the input member 12 to the outer gear member 30 of the first planetary gear subset 24, and the drive gear 80, therefore, receives power from the engine 14 and/or the motor/generators 56 and/or 72. The drive gear 80 meshingly engages an idler gear 82 which, in turn, meshingly engages a transfer gear 84 that is secured to one end of a shaft 86. The other end of the shaft 86 may be secured to a transmission fluid pump and 88 which is supplied transmission fluid from sump 37, delivering high pressure fluid to regulator 39 which returns a portion of the fluid to sump 37 and provides regulated line pressure in line 41.

In the described exemplary mechanical arrangement, the output member 64 receives power through two distinct gear trains within the EVT 10. A first mode, or gear train, is selected when the first clutch C1 is actuated in order to "ground" the outer gear member 46 of the third planetary gear subset 28. A second mode, or gear train, is selected when the first clutch C1 is released and the second clutch C2 is simultaneously actuated to connect the shaft 60 to the carrier 52 of the third planetary gear subset 28.

Those skilled in the art will appreciate that the EVT 10 is capable of providing a range of output speeds from relatively slow to relatively fast within each mode of operation. This combination of two modes with a slow to fast output speed range in each mode allows the EVT 10 to propel a vehicle from a stationary condition to highway speeds. In addition, a fixed-ratio state wherein both clutches C1 and C2 are simultaneously applied is available for efficient mechanical coupling of the input member to the output member through a fixed gear ratio. Furthermore, a neutral state wherein both clutches C1 and C2 are simultaneously released is available for mechanically decoupling the output member from the transmission. Finally, the EVT 10 is capable to provide synchronized shifts between the modes wherein slip speed across both clutches C1 and C2 is substantially zero. Additional details regarding operation of the exemplary EVT can be found in commonly assigned U.S. Pat. No. 5,931,757, the contents of which are incorporated herein by reference.

Engine 14 is preferably a diesel engine and electronically controlled by engine control module 23 as illustrated in FIG. 2. ECM 23 is a conventional microprocessor based diesel engine controller comprising such common elements as microprocessor, read only memory ROM, random access memory RAM, electrically programmable read only memory EPROM, high speed clock, analog to digital (A/D) and digital to analog (D/A) circuitry, and input/output circuitry and devices (I/O) and appropriate signal conditioning and buffer circuitry. ECM 23 functions to acquire data from a variety of sensors and control a variety of actuators, respectively, of the engine 14 over a plurality of discrete lines. For simplicity, ECM 23 is shown generally in bi-directional interface with engine 14 via aggregate line 35. Among the various parameters that may be sensed by ECM 23 are oil sump and engine coolant temperatures, engine speed (Ne), turbo pressure, and ambient air temperature and pressure. Various actuators that may be controlled by the ECM 23 include fuel injectors, fan controllers, engine preheaters including glow plugs and grid-type intake air heaters. ECM 23 preferably provides for well known torque-based controls for engine 14 in response to a torque command Te_cmd provided by the EVT control system. Such engines electronics, controls and quantities are generally well known to those skilled in the art and further detailed exposition thereof is not required herein.

As should be apparent from the foregoing description the EVT 10 selectively receives power from the engine 14. As will now be explained with continued reference to FIG. 2 the EVT also receives power from an electric energy storage device or system (ESS), such as one or more batteries in battery pack module (BPM) 21. As used herein, reference to a battery includes not only a single battery, also includes any combination of single or multiple batteries, or cells thereof, into a battery pack or array, or a plurality of battery packs or arrays. BPM 21 is preferably a parallel array of battery packs, each of which comprises a plurality of batteries. As used herein, the term battery generally refers to any secondary or rechargeable battery, but those comprising lead/acid, nickel/metal hydride (Ni/MH), or Li/ion or polymer cells are preferred. Other electric energy storage devices that have the ability to store electric power through charging and dispense electric power through discharging, such as super capacitors or ultracapacitors, may be used in place of, or in combination with, the batteries without altering the concepts of the present invention. The BPM 21 is high voltage DC (e.g., about 650 V in an exemplary embodiment) coupled to dual power inverter module (DPIM) 19 via DC lines 27. Current is transferable to or from the BPM 21 in accordance with whether the BPM 21 is being charged or discharged. BPM 21 also comprises a conventional microprocessor based controller comprising such common elements as microprocessor, read only memory ROM, random access memory RAM, electrically programmable read only memory EPROM, high speed clock, analog to digital (A/D) and digital to analog (D/A) circuitry, and input/output circuitry and devices (I/O), temperature sensors and appropriate signal conditioning and buffer circuitry necessary to monitor the state of the battery and transmit this information to other portions of the control system, e.g. system controller 43, for use in the overall control of the vehicle. This includes sensing, processing, calculating and otherwise monitoring various parametric information regarding the state or condition of the battery, such as temperature, current and voltage while charging and discharging, and state of charge (SOC), which comprises the instantaneous amount of energy stored in the battery expressed as a percentage of its total energy storage capacity. The information concerning these parameters is provided to other portions of the vehicle control system for use in conjunction with control algorithms which make use of battery parametric information, such as those used to establish SOC related charge and discharge limits, amp-hour/hour or energy throughput limits, temperature limits or other battery-related control functions. Further details regarding ESS monitoring and functionality the can be found in commonly assigned, co-pending U.S. patent application Ser. No. 10/686,180 and U.S. patent application Ser. No. 10/686,174, which are incorporated herein by reference.

DPIM 19 includes a pair of power inverters and respective motor controllers configured to receive motor control commands and control inverter states therefrom for providing motor drive or regeneration functionality. Motor controllers are microprocessor based controllers comprising such common elements as microprocessor, read only memory ROM, random access memory RAM, electrically programmable read only memory EPROM, high speed clock, analog to digital (A/D) and digital to analog (D/A) circuitry, and input/output circuitry and devices (I/O) and appropriate signal conditioning and buffer circuitry. In motoring control, the respective inverter receives current from the DC lines and provides AC current to the respective motor over high voltage phase lines 29 and 31. In regeneration control, the respective inverter receives AC current from the motor over high voltage phase lines 29 and 31 and provides current to the DC lines 27. The net DC current provided to or from the inverters determines the charge or discharge operating mode of the BPM 21. Preferably, $M_A$ and $M_B$ are three-phase AC machines and the inverters comprise complementary three-phase power electronics. Individual motor speed signals Na and Nb for $M_A$ and $M_B$, respectively, are also derived by the DPIM 19 from the motor phase information or conventional rotation sensors. Such motors, electronics, controls and quantities are generally well known to those skilled in the art and further detailed exposition thereof is not required herein.

System controller 43 is a microprocessor based controller comprising such common elements as microprocessor, read only memory ROM, random access memory RAM, electrically programmable read only memory EPROM, high speed clock, analog to digital (A/D) and digital to analog (D/A) circuitry, digital signal processor (DSP), and input/output circuitry and devices (I/O) and appropriate signal conditioning and buffer circuitry. In the exemplary embodiment, system controller 43 comprises a pair of microprocessor based controllers designated as vehicle control module (VCM) 15 and transmission control module (TCM) 17. VCM and TCM may provide, for example, a variety of control and diagnostic functions related to EVT and vehicle chassis including, for example, engine torque commands, input speed control, and output torque control in coordination with regenerative braking, anti-lock braking and traction control. Particularly with respect to EVT functionality, system controller 43 functions to directly acquire data from a variety of sensors and directly control a variety of actuators, respectively, of the EVT over a plurality of discrete lines. For simplicity, system controller 43 is shown generally in bi-directional interface with EVT via aggregate line 33. Of particular note, system controller 43 receives frequency signals from rotation sensors for processing into input member 12 speed Ni and output member 64 speed No for use in the control of EVT 10. System controller 43 may also receive and process pressure signals from pressure switches (not separately illustrated) for monitoring clutch C1 and C2 application chamber pressures. Alternatively, pressure transducers for wide range pressure monitoring may be employed. PWM and/or binary control signals are provided by system controller to EVT 10 for controlling fill and drain of clutches C1 and C2 for application and release thereof. Additionally, system controller 43 may receive transmission fluid sump 37 temperature data, such as from conventional thermocouple input (not separately illustrated) to derive sump temperature Ts and provide a PWM signal which may be derived from input speed Ni and sump temperature Ts for control of line pressure via regulator 39. Fill and drain of clutches C1 and C2 are effectuated by way of solenoid controlled spool valves responsive to PWM and binary control signals as alluded to above. Similarly, line pressure regulator 39 may be of a solenoid controlled variety for establishing regulated line pressure in accordance with the described PWM signal. Such line pressure controls are generally well known to those skilled in the art. Clutch slip speeds across clutches C1 and C2 are derived from output speed No, $M_A$ speed Na and $M_B$ speed Nb; specifically, C1 slip is a function of No and Nb, whereas C2 slip is a function of No, Na and Nb. Also illustrated is user interface (UI) block 13 which comprises such inputs to system controller 43 such as vehicle throttle position, push button shift selector (PBSS) for available drive range selection (e.g. Drive, Reverse, etc.), brake effort and fast idle requests among others. Brake effort may, for example, be provided in pneumatic and hydraulic braking systems from conventional pressure transducers (not shown). Throttle position may, for example, be provided by conventional displacement sensors for transducing pedal travel. System controller 43 determines a torque command Te_cmd and provides it to ECM 23. Torque command Te_cmd is representative of the EVT torque contribution desired from the engine as determined by the system controller.

System controller 43 determines a desired output torque, To_des, for use in the control of the powertrain. The determination of To_des is made based upon operator input factors such as accelerator pedal position and brake pedal position and vehicle dynamic conditions such as vehicle speed. Other operator input factors such as shift selector position and power take-off requests, vehicle dynamic conditions such as acceleration and deceleration rate, and EVT operational conditions such as temperatures, voltages, currents and speeds may also influence the determination of output torque. System controller 43 also determines the constitution of the output torque in terms of engine and electric machine contributions and splits. Additional details respecting determination of the various torque contributions to the EVT including output torque, engine torque and motors MA and MB torques is disclosed in detail in co-pending U.S. Ser. No. 10/686,511 which is incorporated herein by reference.

The various modules described (i.e. system controller 43, DPIM 19, BPM 21, ECM 23) communicate via controller area network (CAN) bus 25. The CAN bus 25 allows for communication of control parameters and commands between the various modules. The specific communication protocol utilized will be application specific. For example the preferred protocol for heavy duty applications is the Society of Automotive Engineers standard J1939. The CAN bus and appropriate protocols provide for robust messaging and multi-controller interfacing between the system controller, ECM, DPIM, BPIM and other controllers such as antilock brake and traction controllers.

Figure 3:
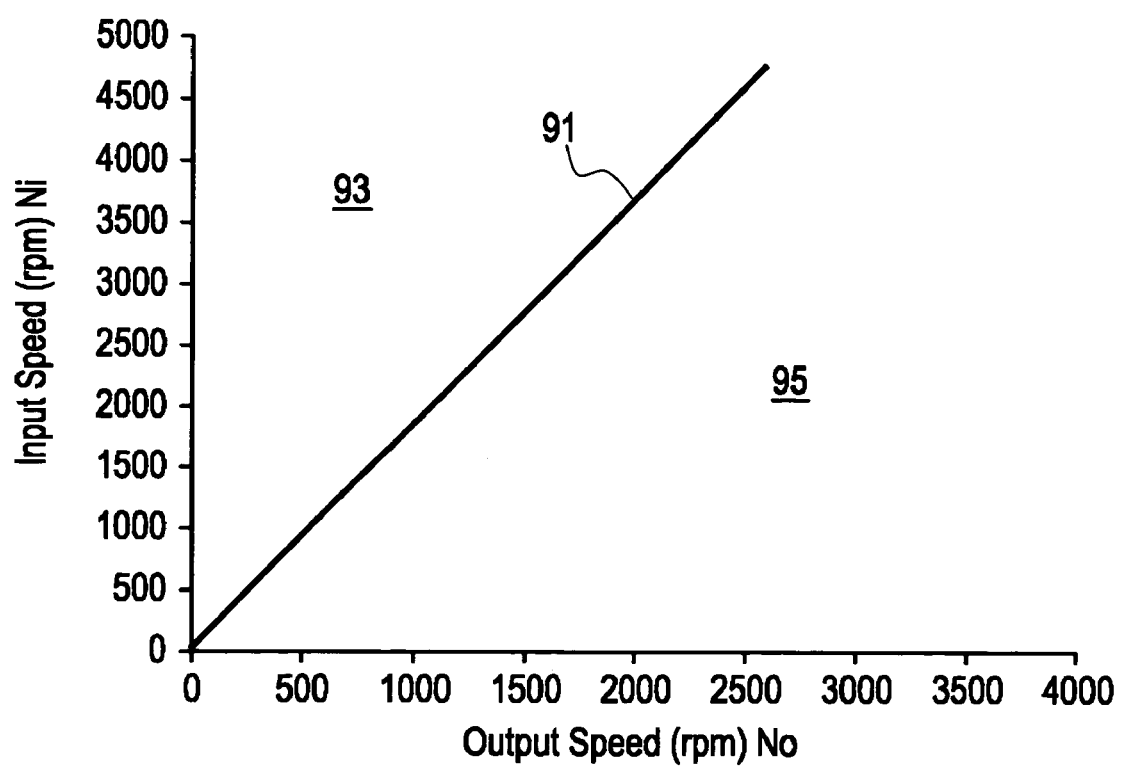
FIG. 3 is a graphical representation of various regions of operation with respect to input and output speeds of the exemplary electrically variable transmission disclosed herein.

With reference to FIG. 3, a plot of output speed No along the horizontal axis versus input speed Ni across the vertical axis for the EVT 10 is illustrated. Synchronous operation, that is the input speed and output speed relationships whereat both clutch C1 and C2 are operating simultaneously with substantially zero slip speed thereacross is represented by line 91. As such, it represents the input and output speed relationships substantially whereat synchronous shifting from between modes can occur or whereat direct mechanical coupling from input to output can be affected by simultaneous application of both clutches C1 and C2, also known as fixed-ratio. One particular gearset relationship capable of producing the synchronous operation depicted by line 91 in FIG. 3 is as follows: outer gear member 30 having 91 teeth, inner gear member 32 having 49 teeth, planet gear members 34 having 21 teeth; outer gear member 38 having 91 teeth, inner gear member 40 having 49 teeth, planet gear members 42 having 21 teeth; outer gear member 46 having 89 teeth, inner gear member 48 having 31 teeth, planet gear members 50 having 29 teeth. Line 91 may be variously referred to herein as synchronous line, shift ratio line or fixed-ratio line.

To the left of the shift ratio line 91 is a preferred region of operation 93 for the first mode wherein C1 is applied and C2 is released. To the right of the shift ratio line 91 is a preferred region of operation 95 for the second mode wherein C1 is released and C2 is applied. When used herein with respect to clutches C1 and C2, the term applied indicates substantial torque transfer capacity across the respective clutch while the term released indicates insubstantial torque transfer capacity across the respective clutch. Since it is generally preferred to cause shifts from one mode to the other to occur synchronously, torque transfers from one mode into the other mode are caused to occur through a two clutch application fixed ratio wherein, for a finite period prior to the release of the presently applied clutch, the presently released clutch is applied. And, the mode change is completed when fixed-ratio is exited by the continued application of the clutch associated with the mode being entered and the release of the clutch associated with the mode being exited. While region of operation 93 is generally preferred for the operation of the EVT in MODE 1, it is not meant to imply that MODE 2 operation of the EVT cannot or does not occur therein. Generally, however, it is preferred to operate in MODE 1 in region 93 because MODE 1 preferably employs gearsets and motor hardware particularly well suited in various aspects (e.g. mass, size, cost, inertial capabilities, etc.) to the high launch torques of region 93. Similarly, while region of operation 95 is generally preferred for the operation of the EVT in MODE 2, it is not meant to imply that MODE 1 operation of the EVT cannot or does not occur therein. Generally, however, it is preferred to operate in MODE 2 in region 95 because MODE 2 preferably employs gearsets and motor hardware particularly well suited in various aspects (e.g. mass, size, cost, inertial capabilities, etc.) to the high speeds of region 93. A shift into MODE 1 is considered a downshift and is associated with a higher gear ratio in accordance with the relationship of Ni/No. Likewise, a shift into MODE 2 is considered an upshift and is associated with a lower gear ratio in accordance with the relationship of Ni/No.

Under normal operating conditions the propulsion control system will maintain the energy storage system SOC within prescribed limits, it being well understood that depleted and overcharged batteries are at significant risk for irreversible damage. The present invention addresses situations wherein the vehicle operating conditions are such that the charge or discharge limits as measured by SOC are such that additional charging or discharging, as the case may be, may result in battery damage.

Figure 4:
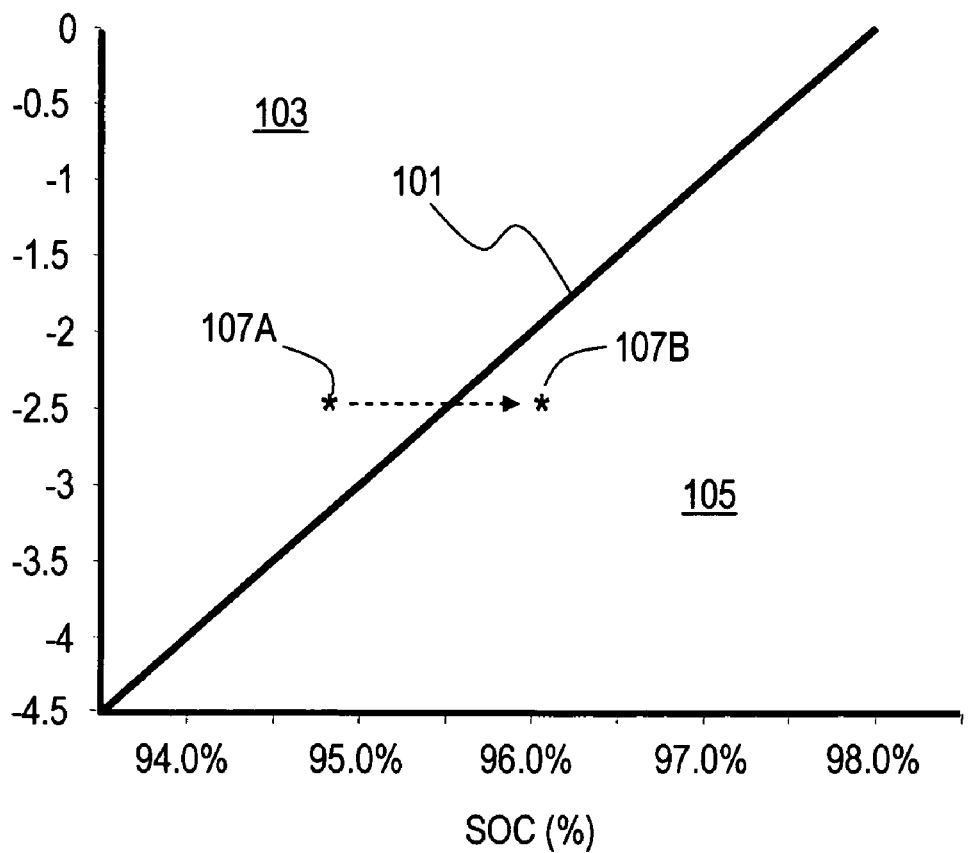
FIG. 4 is a graphical representation of battery power thresholds as a function of state of charge for extreme high state of charge conditions.

In accordance with the present invention, operation outside of predetermined SOC limits, corresponding to relatively high and low SOCs, will be allowed to continue normally provided that the power flows are actually improving the SOC or the power flow magnitude is not deemed an incipient threat to battery condition at the present SOC. For example, with reference to FIG. 4, a high SOC region of interest (e.g. SOC>93.5% predetermined limit) is plotted against a range of battery charge powers. The convention used herein is that discharging powers are positive and charging powers are negative. Line 101 delineates regions 103 and 105. Operating points defined by power flow and SOC combinations within region 103 are generally not considered to define an incipient threat to battery condition, e.g. point 107A. Generally, however, such continued charging power flows would trend SOC higher and thus the operating point would eventually be in region 105, e.g. point 107B. Such operating points defined by power flow and SOC combinations within region 105 are, however, generally considered to define an incipient threat to battery condition. As can be seen by following line 101, as SOC trends higher, e.g. further outside of the predetermined SOC limits, the magnitude of battery charge power required to define an incipient threat to battery condition decreases. In other words, in the case of high SOCs, the higher the SOC, the less recharging is tolerated. It follows, too, that an operating point defined in part by discharging power flows, i.e. positive power values, will generally trend the SOC lower and thus trend the operating point further away from line 101 and region 105.

Figure 5:
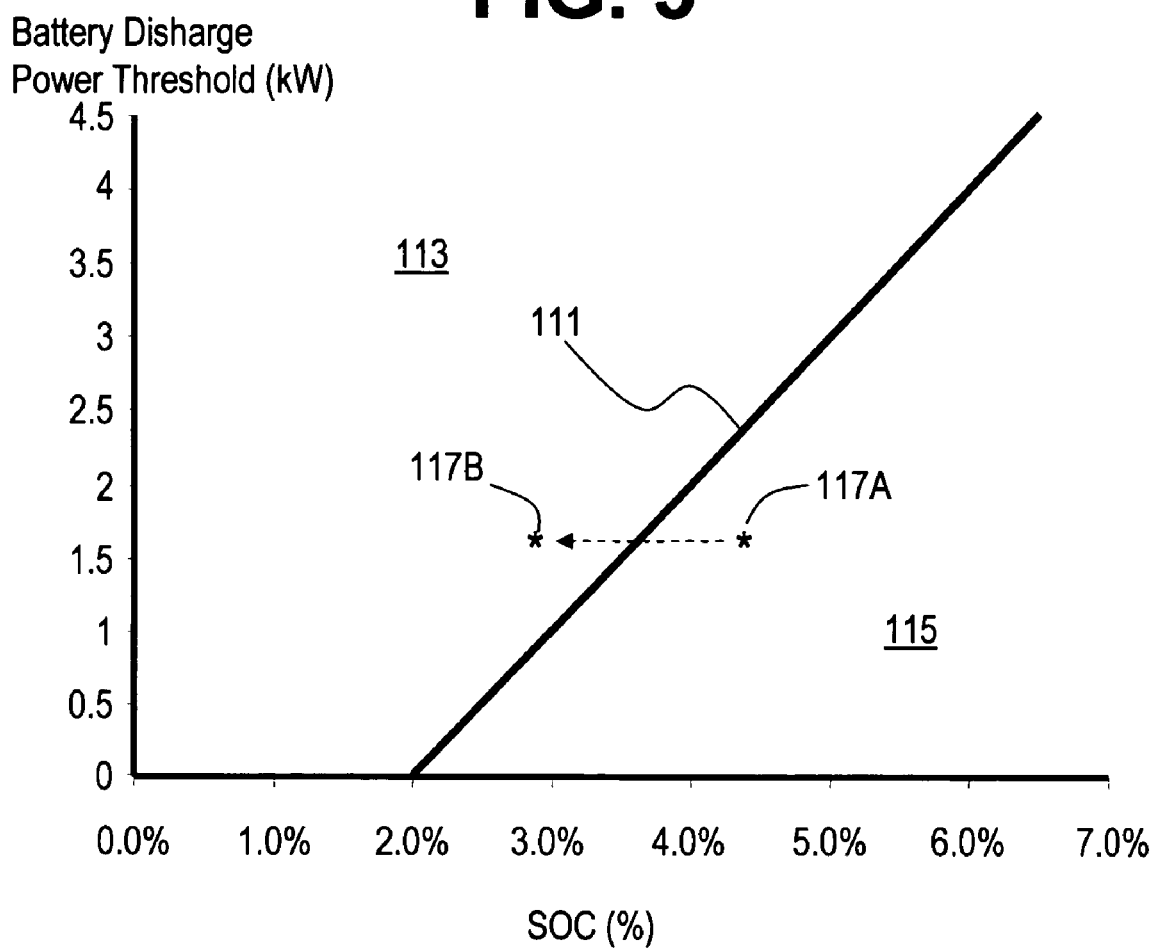
FIG. 5 is a graphical representation of battery power thresholds as a function of state of charge for extreme low state of charge conditions.

Similarly with respect to relatively low SOCs, with reference to FIG. 5, a low SOC region of interest (e.g. SOC<6.5% predetermined limit) is plotted against a range of battery discharge powers. Once again, the convention used herein is that discharging powers are positive and charging powers are negative. Line 111 delineates regions 113 and 115. Operating points defined by power flow and SOC combinations within region 115 are generally not considered to define an incipient threat to battery condition, e.g. point 117A. Generally, however, such continued discharging power flows would trend SOC lower and thus the operating point would eventually be in region 113, e.g. point 117B. Such operating points defined by power flow and SOC combinations within region 113 are, however, generally considered to define an incipient threat to battery condition. As can be seen by following line 111, as SOC trends lower, e.g. further outside of the predetermined SOC limits, the magnitude of battery discharge power required to define an incipient threat to battery condition decreases. In other words, in the case of low SOCs, the lower the SOC, the less discharging is tolerated. It follows, too, that an operating point defined in part by charging power flows, i.e. negative power values, will generally trend the SOC higher and thus trend the operating point further away from line 111 and region 113.

Subsequent to the determination that operation is at a point of incipient threat to battery condition, only if the energy storage system continues to operate within predetermined high and low regions of SOC will further power flows be terminated and a diagnostic code logged. The duration during which the energy storage system is permitted to operate in high or low SOC regions is preferably set in accordance with the SOC in much the same manner as the incipient regions are delineated as a function of SOC. This allows for corrective actions to be taken to rectify the power flows and recover the ESS to an acceptable SOC condition, weighted in accordance with the relative imminence of potential battery damage through continued operation within the high or low SOC region. This control will continue to allow vehicle operation under these conditions as long as the propulsion control system is attempting to correct the SOC to an acceptable region.

As part of the criteria in determining whether a high SOC or low SOC diagnostic should be logged, the control verifies that the battery SOC violates certain SOC diagnostic thresholds for a predetermined and calibratable duration. This duration is preferably variable in accordance with how high or how low the SOC is. In accordance with a preferred implementation with respect to a high SOC, there are three different SOC diagnostic threshold levels and three different counter increment levels corresponding thereto. These different thresholds are in place to allow sufficient opportunity for the propulsion control system to take corrective action in the event an incipient threat to battery condition initiated the diagnostic yet allow the vehicle to continue to operate. In the case of a high SOC, the higher the SOC rises the larger the diagnostic counter increment. For example, if the SOC has violated a first SOC diagnostic threshold then the diagnostic counter increment will be a first counter increment X counts every software loop. Whereas, if the SOC has violated a second, higher, SOC diagnostic threshold, then the diagnostic counter increment will be a second, larger, counter increment Y counts every software loop. And, if the SOC has violated a third, even higher, SOC diagnostic threshold, then the diagnostic counter increment will be a third, even larger, counter increment Z counts every software loop. The diagnostic counter will continue to increment as long as the SOC violated the lowest of the SOC diagnostic thresholds.

In accordance with a preferred implementation with respect to a low SOC, there are also three different SOC diagnostic threshold levels and three different counter increment levels. These different thresholds are in place for the same reason as hereinbefore described with respect to high SOCs. In the case of a low SOC, the lower the SOC falls the larger the diagnostic counter increment. For example, if the SOC violates the first SOC diagnostic threshold then the diagnostic counter increment will be a first counter increment X counts every software loop. Whereas, if the SOC violates a second, lower, SOC diagnostic threshold, then the diagnostic counter increment will be a second, larger, counter increment Y counts every software loop. And, if the SOC violates a third, even lower, SOC diagnostic threshold, then the diagnostic counter increment will be a third, even larger, counter increment Z counts every software loop. The diagnostic counter will continue to increment as long as the SOC violates the highest of the SOC diagnostic thresholds.

Figure 6:
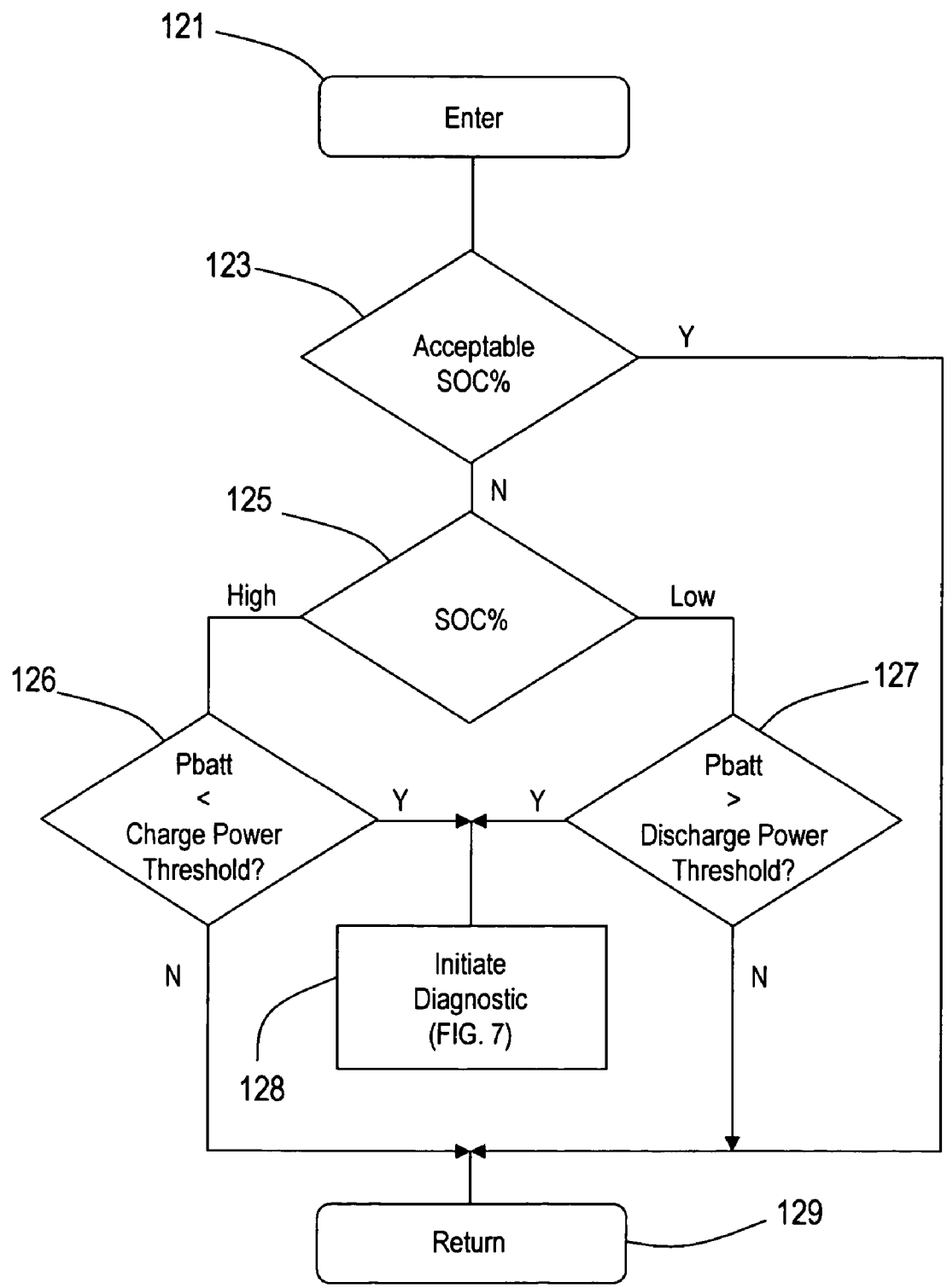
FIG. 6 is a flowchart representing various exemplary state of charge monitoring steps performed in accordance with the present invention.
Figure 7:
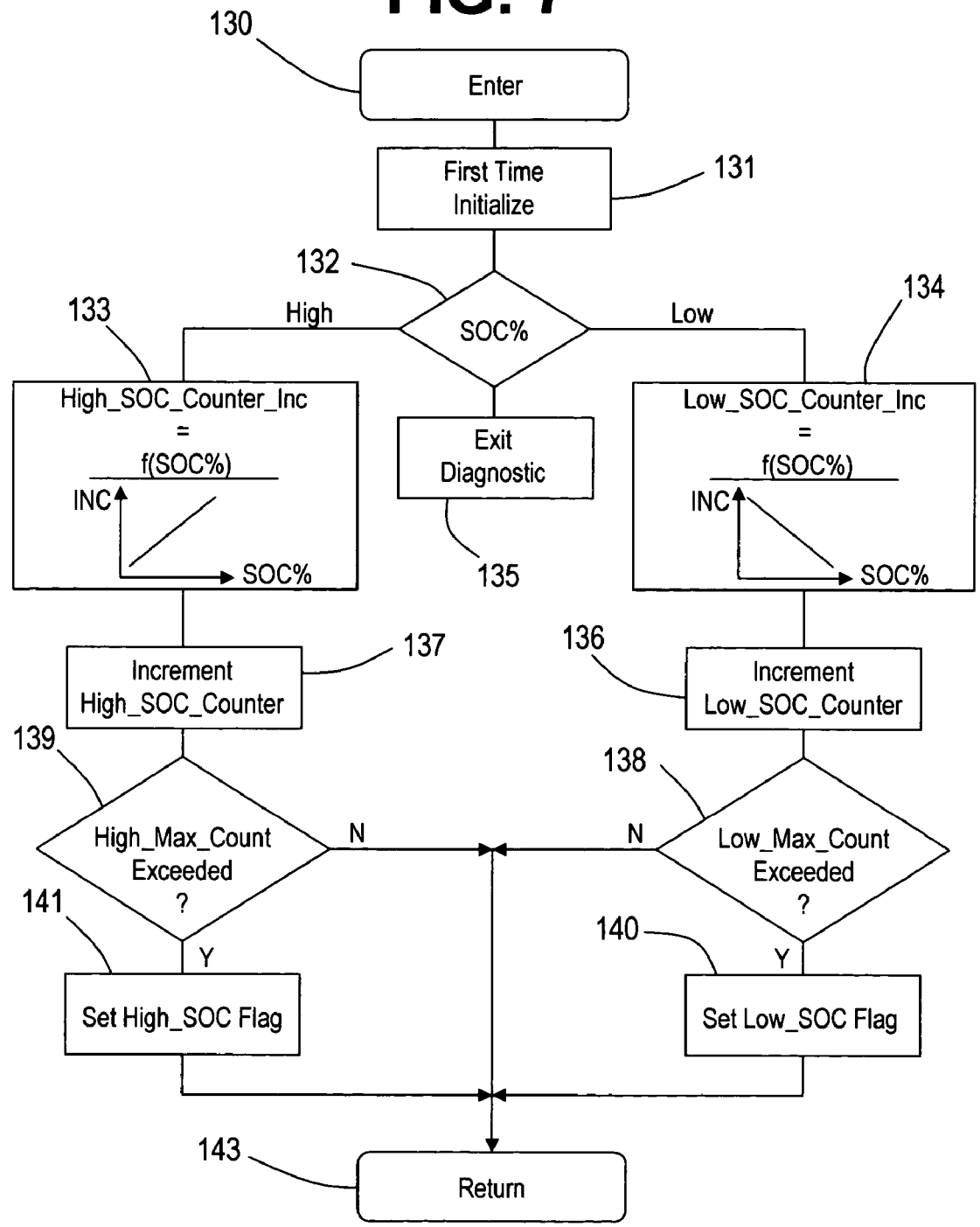
FIG. 7 is a flowchart representing various exemplary SOC diagnostic steps performed in accordance with the present invention.

With reference now to FIGS. 6 and 7, flow charts illustrating representative steps for carrying out the method of the present invention comprising instructions implemented as part of the executable computer code and data structures of system controller 43 are shown. The instructions represented thereby are, of course, executed as a part of a much larger group of instruction sets and routines carrying out the various control and diagnostic function of the powertrain previously described. FIG. 6 particularly illustrates various monitoring steps used to determine whether the energy storage system state of charge is within particularly high or low SOC regions of interest and, if so, then further determining whether an incipient threat to battery condition is present, e.g. operating points within regions 105 or 113 of FIGS. 4 and 5, respectively. FIG. 7 particularly illustrates a diagnostic routine invoked during periods of incipient threat to the battery condition as determined in accordance with the flow chart of FIG. 6.

The first step in FIG. 6 is labeled 121 and comprises initiation of the routine as may be invoked as part of other scheduled routines by timer interrupts on a regular basis or on an event interrupt basis as non-limiting examples. Upon entry, it may be necessary to initialize various flags, counters, timers, variable, registers etc., and such common preparatory functions would be performed at this time. For example, battery power and battery state of charge quantities may be provided in memory locations for reference in the following steps. Next, steps 123 and 125 together represent the determination of whether the SOC is in an acceptable region or within one of a high or low state of charge regions substantially as discussed earlier with respect to FIGS. 4 and 5, respectively. Where SOC is acceptable, there is no need for further steps to be performed and the routine terminates at step 129. However, where the SOC is deemed too high, step 126 determines whether the battery power, Pbatt, is less than a predetermined charge power threshold. This charge power threshold is in the present example a function of the SOC substantially as represented in the previously described FIG. 4. Similarly, where the SOC is deemed too low, step 127 determines whether the battery power is less than a predetermined charge power threshold. This charge power threshold is in the present example a function of the SOC substantially as represented in the previously described FIG. 5. Preferably, charge power thresholds are determined from tables of data stored in non-volatile memory arrays. Alternatively, various equations may be utilized if desired to calculate such thresholds in accordance therewith in real time. An affirmative result to the tests of steps 126 and 127 indicate that the battery power and latest SOC operating point indicates and incipient threat to the battery at high and low SOC, respectively. Hence, step 128 illustrates initiation of a diagnostic to more carefully and particularly monitor the battery power and SOC as will be discussed in further detail below with particular reference to FIG. 7.

FIG. 7 begins at step 130 and comprises initiation of the routine as may be invoked as part of other scheduled routines by timer interrupts on a regular basis or on an event interrupt basis as non-limiting examples. Upon entry, it may be necessary to initialize various flags, counters, timers, variable, registers etc., and such common preparatory functions would be performed at this time. For example, a battery state of charge quantity may be provided in memory locations for reference in the following steps. Next, step 131 represents a similar initialization; however, such initialization is particularly with respect only to items requiring an initialization upon the first pass through the diagnostic routine such as, for example, the diagnostic counter discussed above and incremented during successive loops as further described below. Step 132 next represents the determination of whether the SOC continues to dictate that the diagnostic should continue or has recovered to region where the diagnostic can terminate. If the SOC is above the first high SOC diagnostic threshold, or if the SOC is below the first low SOC diagnostic threshold, then the paths to steps 133 or 134 are followed, respectively. In the event that the SOC is between both the high and low SOC thresholds, then the SOC diagnostic routine is terminated at block 135. If the diagnostic routine is re-initiated subsequent to termination at step 135, e.g. through the routine steps of FIG. 6, then the diagnostic routine of FIG. 7 is once again subject to first time initializations. The first high and first low SOC diagnostic thresholds may, for example, correspond substantially to the predetermined limits of the high and low SOC regions of interest described with respect to determining incipient threat to battery described above in conjunction with FIGS. 4 and 5. Such thresholds may also be chosen to expand the regions to provide an inherent hysteretic effect.

Figure 8:
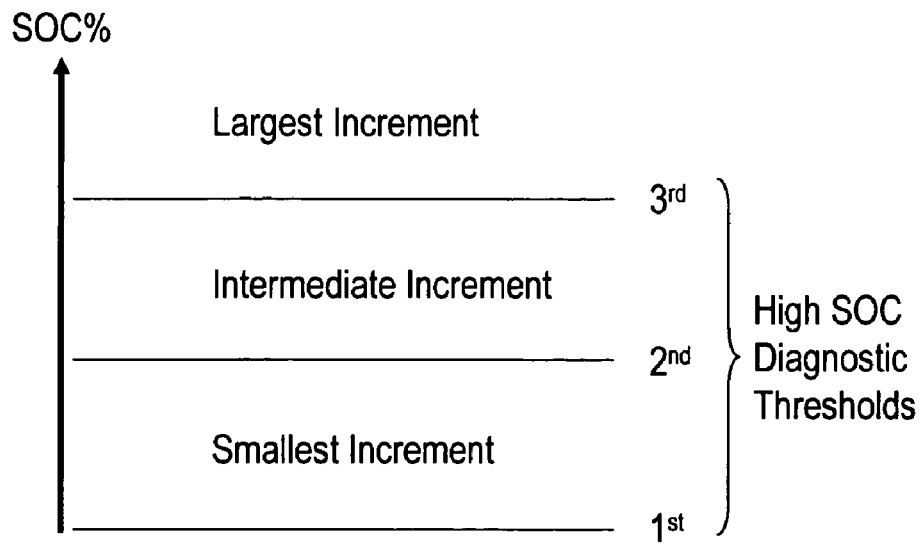
FIG. 8 is a graphic representation of SOC thresholds for high SOC conditions utilized in accordance with the diagnostic of the present invention; and, FIG. 9 is a graphic representation of SOC thresholds for low SOC conditions utilized in accordance with the diagnostic of the present invention.

Taking first an example wherein the SOC is above the first high SOC diagnostic threshold, block 133 represents the determination of the diagnostic counter increment, High_SOC_Counter_Inc for use in incrementing a diagnostic counter. With additional reference to FIG. 8, an SOC that is between the first high SOC diagnostic threshold and the second high SOC diagnostic threshold has violated the first but not the second threshold and would return the smallest increment value for High_SOC_Counter_Inc. Similarly, an SOC that is above the third high SOC diagnostic threshold has violated the third threshold and would return the largest increment value for High_SOC_Counter_Inc. Finally, an SOC that is between the second and third high SOC diagnostic thresholds has violated the second but not the third threshold and would return an increment value intermediate the highest and lowest values for High_SOC_Counter_Inc.

Next at step 137 the diagnostic counter, High_SOC_Counter, is incremented with the increment value returned in the previous step 133. A determination is next made at step 139 whether a predetermined count threshold, High_Max_Count, has been exceed, thus indicating that the SOC has remained above at least the first high SOC diagnostic threshold for a duration beyond which continued operation would not be prudent due to potential battery damage. The actual time of the duration may have been relatively long in the instance wherein the SOC was predominantly between the first and second high SOC diagnostic thresholds. Similarly, the actual time of the duration may have been relatively short in the instance wherein the SOC was predominantly above the third high SOC diagnostic threshold. Therefore, affirmation at step 139 that the count threshold was exceeded results in the setting of the High_SOC flag at step 141, indicating a critically high SOC, and termination of the routine of FIG. 7. Upon return from FIG. 7, the diagnostic code is interpreted and acted upon by other routines, including for example routines effective to prevent further battery power flows. The vehicle operator would then have the opportunity to seek appropriate service of the energy storage system including returning the batteries to a SOC that once again enables normal operation.

Where the count threshold was not exceeded as determined at step 139, the diagnostic routine terminates for this software loop and repeats upon subsequent loops until terminated by SOC recovery as indicated at steps 132 and 135 of the present routine of FIG. 7 or by the setting of the High_SOC flag and execution of alternative damage prevention routines as immediately hereinbefore described.

Figure 9:
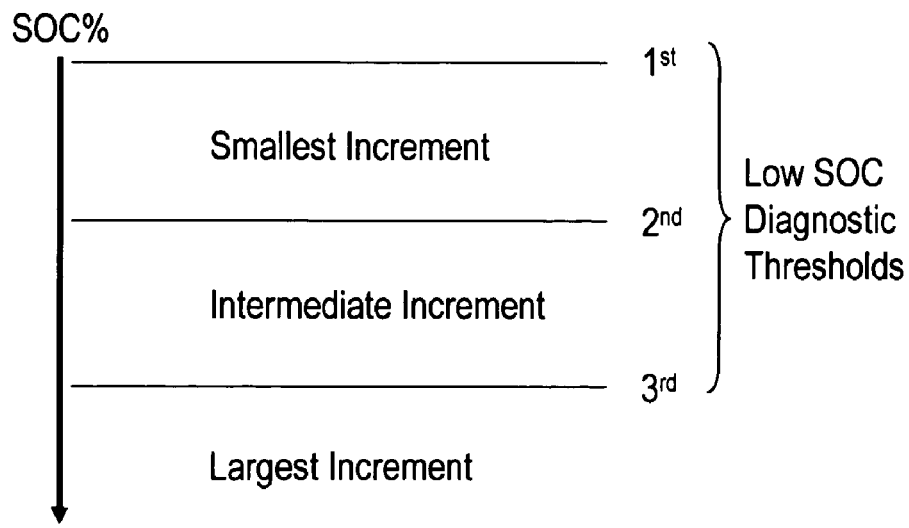

Taking next an example wherein the SOC is below the first low SOC diagnostic threshold, block 134 represents the determination of the diagnostic counter increment, Low_SOC_Counter_Inc for use in incrementing a diagnostic counter. With additional reference to FIG. 9, an SOC that is between the first low SOC diagnostic threshold and the second low SOC diagnostic threshold has violated the first but not the second threshold and would return the smallest increment value for Low_SOC_Counter_Inc. Similarly, an SOC that is below the third high SOC diagnostic threshold has violated the third threshold and would return the largest increment value for Low_SOC_Counter_Inc. Finally, an SOC that is between the second and third low SOC diagnostic thresholds has violated the second but not the third threshold and would return an increment value intermediate the highest and lowest values for Low_SOC_Counter_Inc.

Next at step 136 the diagnostic counter, Low_SOC_Counter, is incremented with the increment value returned in the previous step 134. A determination is next made at step 138 whether a predetermined count threshold, Low_Max_Count, has been exceed, thus indicating that the SOC has remained below at least the first low SOC diagnostic threshold for a duration beyond which continued operation would not be prudent due to potential battery damage. The actual time of the duration may have been relatively long in the instance wherein the SOC was predominantly between the first and second low SOC diagnostic thresholds. Similarly, the actual time of the duration may have been relatively short in the instance wherein the SOC was predominantly below the third low SOC diagnostic threshold. Therefore, affirmation at step 138 that the count threshold was exceeded results in the setting of the Low_SOC flag at step 140, indicating a critically low SOC, and termination of the routine of FIG. 7. Upon return from FIG. 7, the diagnostic code is interpreted and acted upon by other routines, including for example routines effective to prevent further battery power flows. The vehicle operator would then have the opportunity to seek appropriate service of the energy storage system including returning the batteries to a SOC that once again enables normal operation.

Where the count threshold was not exceeded as determined at step 138, the diagnostic routine terminates for this software loop and repeats upon subsequent loops until terminated by SOC recovery as indicated at steps 132 and 135 of the present routine of FIG. 7 or by the setting of the Low_SOC flag and execution of alternative damage prevention routines as immediately hereinbefore described.

It is to be noted that the various thresholds, increments and such other operatives respecting the routines described herein for the low and high SOC conditions may or may not be operatively equivalent or symmetrical. In fact, it is more likely that because of the difference in the battery characteristics the thresholds, durations and even the resolution desired for the low and high SOC conditions may be significantly different. Also, incrementing a counter as used herein is equivalent to decrementing a counter for the same purpose.

While the invention has been described by reference to certain preferred embodiments, it should be understood that numerous changes could be made within the spirit and scope of the inventive concepts described. Accordingly, it is intended that the invention not be limited to the disclosed embodiments, but that it have the full scope permitted by the language of the following claims.

The invention claimed is:

1. Method for diagnosing a critical state of charge condition of an energy storage system, comprising:
    obtaining power flow and state of charge for the energy storage system;
    determining if the combination of power flow and state of charge meet predetermined criteria;
    if the predetermined criteria are met, indicating a critical state of charge condition if the state of charge is outside of a predetermined region of state of charge for a predetermined duration;
    wherein the predetermined duration is a function of the state of charge that generally decreases as the state of charge trends away from the predetermined region of state of charge and generally increases as the state of charge trends toward the predetermined region of state of charge.

2. Method for diagnosing a critical state of charge condition of an energy storage system as claimed in claim 1 wherein the predetermined criteria are characterized by increasingly less tolerance for charge power flow at increasingly higher state of charge.

3. Method for diagnosing a critical state of charge condition of an energy storage system as claimed in claim 1 wherein the predetermined criteria are characterized by increasingly less tolerance for discharge power flow at increasingly lower state of charge.

4. Method for diagnosing a critical state of charge condition of an energy storage system, comprising:
    establishing charge and discharge thresholds for the energy storage system as a function of state of charge within predetermined regions of extreme high and low state of charge, respectively;
    obtaining energy storage system power and state of charge;
    comparing the energy storage system power to the appropriate one of the charge and discharge thresholds after the state of charge enters one of the predetermined regions of high and low state of charge from an intermediate region of state of charge;
    if the energy storage system power violates the appropriate one of the charge and discharge thresholds while the state of charge is within the one of the predetermined regions of high and low state of charge, monitoring the duration that the state of charge remains within the one of the predetermined regions of high and low state of charge; and,
    if the duration exceeds a predetermined duration, providing an indication of a critical state of charge condition.

5. The method for monitoring an energy storage system state of charge as claimed in claim 4 wherein the predetermined duration is a function of the state of charge that generally decreases as the state of charge moves away from the intermediate region of state of charge and generally increases as the state of charge moves toward the intermediate region of state of charge.

6. Method for diagnosing a critical state of charge condition of an energy storage system, comprising:

within a predefined extreme range of state of charge, providing a plurality of state of charge thresholds and a corresponding plurality of unique increment values, said increment values being larger the further away the corresponding state of charge threshold is from a predefined non-extreme range of state of charge;

periodically obtaining state of charge;

for so long as state of charge is outside of the predefined range of non-extreme state of charge comparing the state of charge to the state of charge thresholds and selecting one of said increments in accord with the comparison;

incrementing a counter with the selected increment;

comparing the counter to a counter limit; and providing an indication of a critical state of charge condition if said counter exceeds said counter limit.

7. The method for diagnosing a critical state of charge condition of an energy storage system as claimed in claim 6 wherein the predefined extreme range of state of charge corresponds to high state of charge.

8. The method for diagnosing a critical state of charge condition of an energy storage system as claimed in claim 6 wherein the predefined extreme range of state of charge corresponds to low state of charge.

9. Method for diagnosing a critical state of charge condition of an energy storage system, comprising:

obtaining power flow and stale of charge for the energy storage system;

detecting an incipient threat to the energy storage system condition as a function of energy storage system state of charge and energy storage system power flow when energy storage system exceeds a predetermined high state of charge, wherein detecting an incipient threat to the energy storage system condition is increasingly sensitive to energy storage system power flow into the energy storage system as energy storage system state of charge increases; and subsequent to detecting an incipient threat to the energy storage system conditions diagnosing a critical state of charge condition if the state of charge exceeds the predetermined high state of charge for a duration that is variable as a function of the state of charge, wherein the duration is reduced as energy storage system state of charge increases.

10. Method for diagnosing a critical state of charge condition of an energy storage system, comprising:

obtaining power flow and state of charge for the energy storage system;

detecting an incipient threat to the energy storage system condition as a function of energy storage system state of charge and energy storage system power flow when energy storage system is below a predetermined low state of charge, wherein detecting an incipient threat to the energy storage system condition is increasingly sensitive to energy storage system power flow out of the energy storage system as energy storage system state of charge decreases; and subsequent to detecting an incipient threat to the energy storage system condition, diagnosing a critical state of charge condition if the state of charge is below the predetermined low state of charge for a duration that is variable as a function of the state of charge, wherein the duration is reduced as energy storage system state of charge decreases.

* * * * *